United States Patent [19]
Furnival

[11] Patent Number: 5,914,577
[45] Date of Patent: Jun. 22, 1999

[54] POWER TRAIN PARTITION FOR 10 HORSEPOWER MOTOR CONTROLLER

[75] Inventor: Courtney Furnival, Temecula, Calif.

[73] Assignee: International Rectifier Corporation, El Segundo, Calif.

[21] Appl. No.: 08/845,078

[22] Filed: Apr. 18, 1997

Related U.S. Application Data

[60] Provisional application No. 60/015,839, Apr. 18, 1996.

[51] Int. Cl.$^6$ .................................................. H05K 7/02
[52] U.S. Cl. .................. 318/538; 310/68 R; 310/71; 361/736
[58] Field of Search ................. 318/138, 254, 318/439, 538, 801; 310/67 R, 68 R, 71, 68 C, 68 D; 361/600, 728, 736, 748, 760, 761, 763, 765, 807

[56] References Cited

U.S. PATENT DOCUMENTS

| | | | |
|---|---|---|---|
| 4,668,898 | 5/1987 | Harms et al. ........................... | 318/254 |
| 4,908,734 | 3/1990 | Fujioka ................................... | 361/383 |
| 5,602,451 | 2/1997 | Kohge et al. ........................... | 318/293 |
| 5,610,493 | 3/1997 | Wieloch ................................. | 318/801 |
| 5,623,191 | 4/1997 | Wieloch ................................. | 318/801 |
| 5,675,223 | 10/1997 | Yoshizawa et al. .................... | 318/139 |

*Primary Examiner*—Bentsu Ro
*Attorney, Agent, or Firm*—Ostrolenk, Faber, Gerb & Soffen, LLP

[57] ABSTRACT

A power train assembly for delivering electrical power to a driven device such as a motor is constructed of an IMS board and a PCB. A considerably smaller and standardized IMS board is obtained by limiting the components on the IMS board to include only inverter transistors, input rectifiers and a thermistor. The only other component is a connector for effecting a simple vertical connection to the overhead printed circuit board which contains the device control and drive components. The power train assembly realizes surface board savings on the order of between 40% to 50% in the IMS. The height of the IMS is also reduced, which makes it possible to replace the usual potting compound with a thin surface coating.

16 Claims, 16 Drawing Sheets

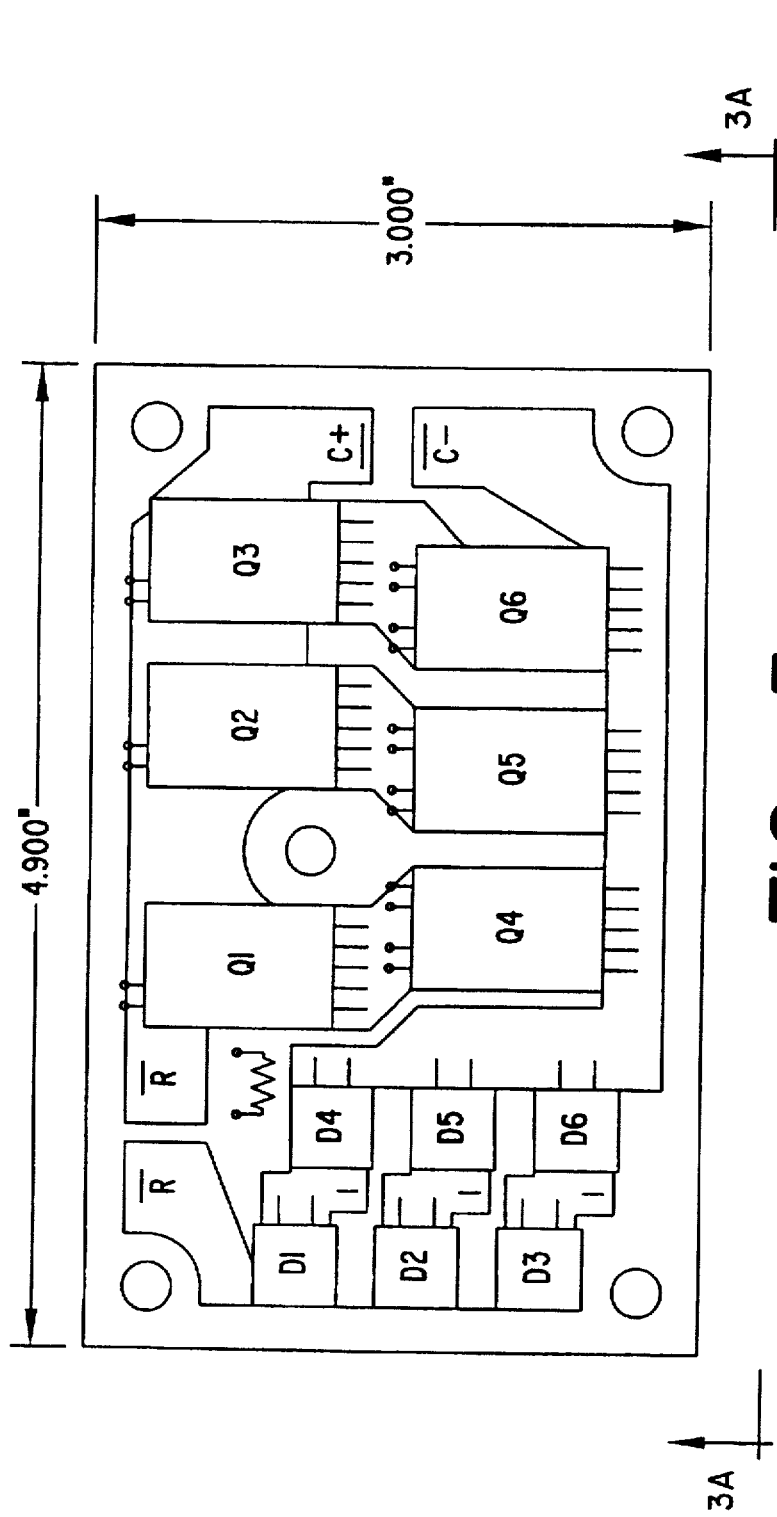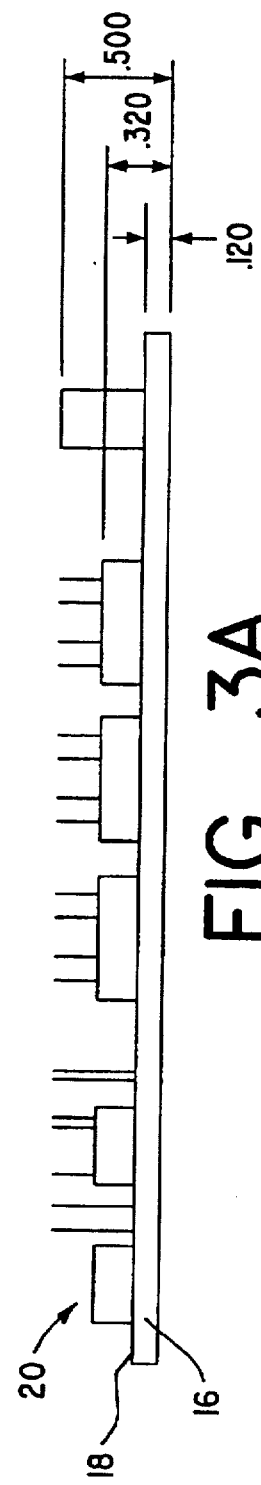
FIG. 3
FIG. 3A

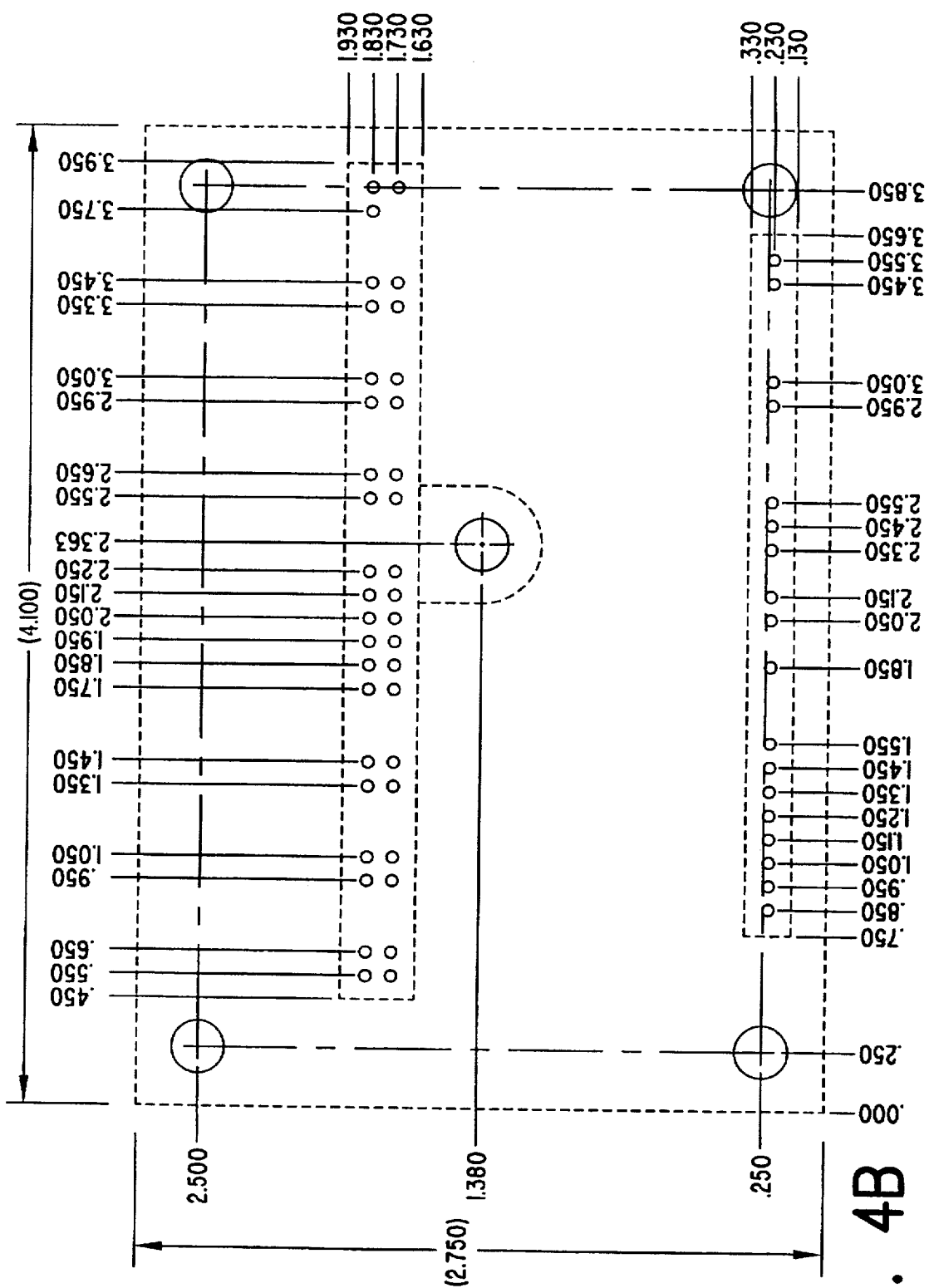

POWER TRAIN PARTITION FOR 10 HORSEPOWER MOTOR CONTROLLER

CROSS REFERENCE TO RELATED APPLICATION

Under the provisions of 35 U.S.C. §120, this application claims priority to related U.S. Provisional Application No. 60/015,839, filed Apr. 18, 1996 and entitled POWER TRAIN PARTITIONING FOR 10 HORSEPOWER MOTOR CONTROLLER.

BACKGROUND OF THE INVENTION

The present invention relates to electronic control circuitry, and more particularly to a motor controller with an improved power train partitioning layout.

Particularly with high volume products, the desirability of providing circuits which require less circuit board space and which can be packed in smaller and preferably modular packages that can be adapted to a diverse range of requirements is self-evident.

The present invention is directly concerned with power train circuits for motor controllers and the like which incorporate surface mounted power devices (SMDs) and insulated metal substrate (IMS) support boards which are more compact, more efficient to build and maintain and, importantly, have a reduced part count.

SUMMARY OF THE INVENTION

A key object of the present invention is to provide a power module for such applications as motor drivers which requires fewer electrical components and which is modularly constructed and more easily adaptable to different requirements.

The foregoing and other objects of the invention are realized by a power module which carefully lays out and allocates its various components between an insulated metal substrate (IMS) board and a printed circuit board (PCB). The partitioning of elements between the IMS and the PCB optimizes electrical connections, so that connections are provided as much as possible through the PCB. The partitioning of the circuit elements reduces the IMS size and therefore costs and results in a more standardized power module in which customer application-specific differences reside in the PCB.

The power module of the present invention, in accordance with a preferred embodiment thereof, includes only the inverter (comprising six SMD10 Copaks), an input rectifier (comprising six SMD diodes in a TO220 style package) and a thermistor on the IMS board. Also included are plural vertical connectors to the driver PCB, which is located overhead.

The SMD10 copak consists of an IGBT die and a fast recovery diode mounted in a common surface mount package. The overall IMS/PCB combination eliminates ten (10) large M5 terminals and four (4) current transformers from the IMS board.

The foregoing is combined with additional circuit optimization including a single gauge package or a dual gauge package, which reduces the IMS substrate size from about 36.5 square inches to: 1) 18.9 square inches for an IMS with single gauge packages (for a 52% saving) or 2) 14.7 square inches (40% circuit board saving) for an IMS with dual gauge packages. It also reduces the IMS module height from 1.000 inch to 0.320 inches. Finally, with a reduced size the invention obviates the need for conventional potting compound usually needed for such assemblies, relying instead on a thin surface coating.

Other features and advantages of the present invention will become apparent from the following description of the invention which refers to the accompanying drawings.

BRIEF DESCRIPTION OF THE DRAWINGS

FIG. 1a shows the IMS board of FIG. 1, as seen along lines 1a—1a.

FIG. 3 is an assembly of the IMS board in accordance with a second embodiment of the present invention for a dual gauge surface mount device.

FIG. 3a shows the IMS board of FIG. 3, as seen along lines 3a—3a thereof.

FIGS. 4a–4b; 5a–5d; 6a–6e and 7a–7b are further assembly drawings for different embodiments of the invention.

DETAILED DESCRIPTION OF EMBODIMENTS OF THE INVENTION

Figure 1:
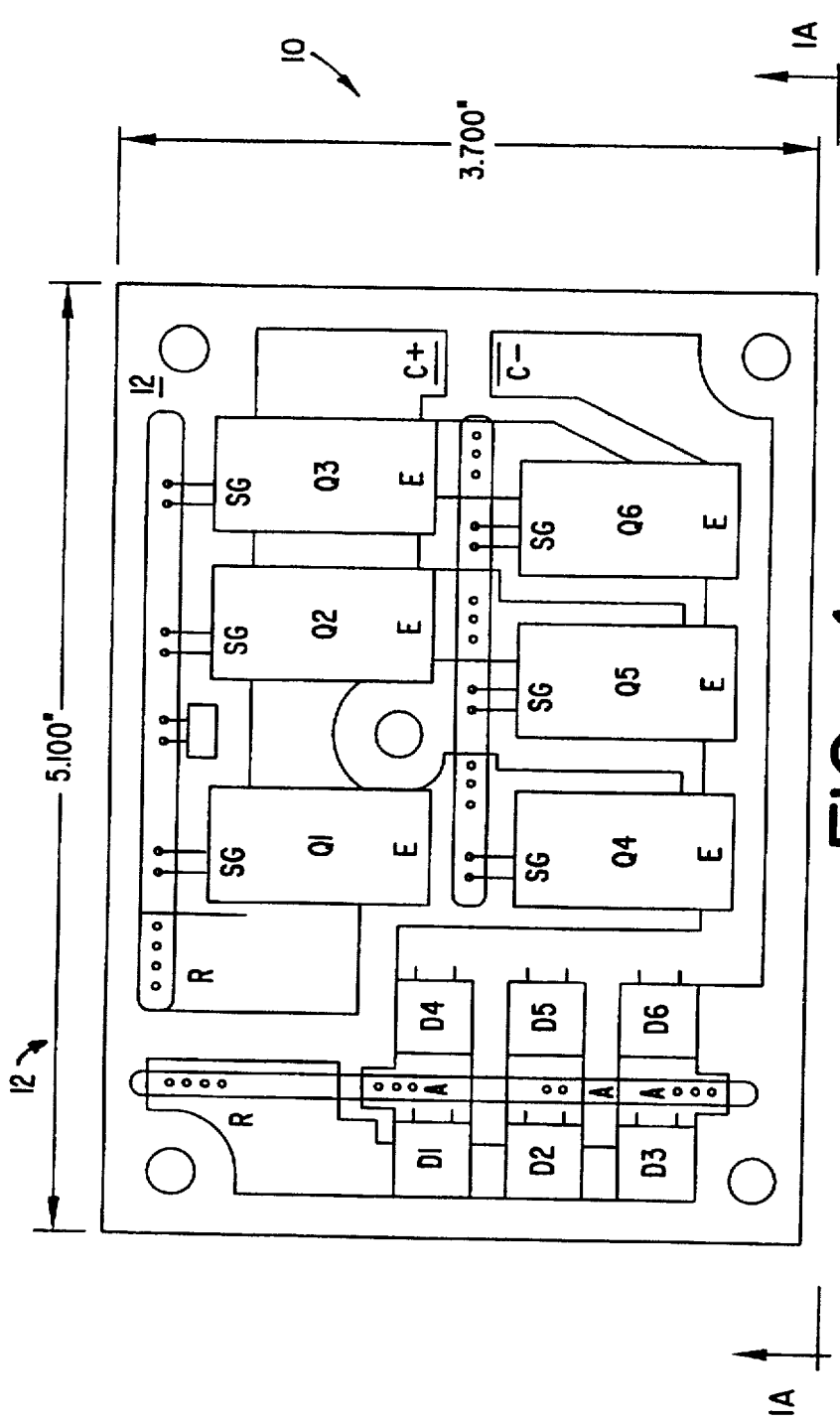
FIG. 1 is an assembly drawing of an IMS board in accordance with a first embodiment of the invention for a single gauge surface mount device.

With reference to the figures, there is disclosed a printed circuit board which is intended to provide custom drivers, current sensing circuits and connections to another board which comprises the power board that houses the AC and motor terminal block and the controller connector. FIGS. 1 and 2 collectively illustrate an SMD/IMS/PCB power-delivering assembly 10 for a 10 horsepower motor controller comprising an IMS board or assembly 12 and a PCB 14. The IMS assembly 12 comprises (FIG. 1a) a heatsink 17, an SMD/IMS substrate 18, driver and partition circuitry 20, two series linked capacitors, and an optional snubber capacitor.

Figure 1A:
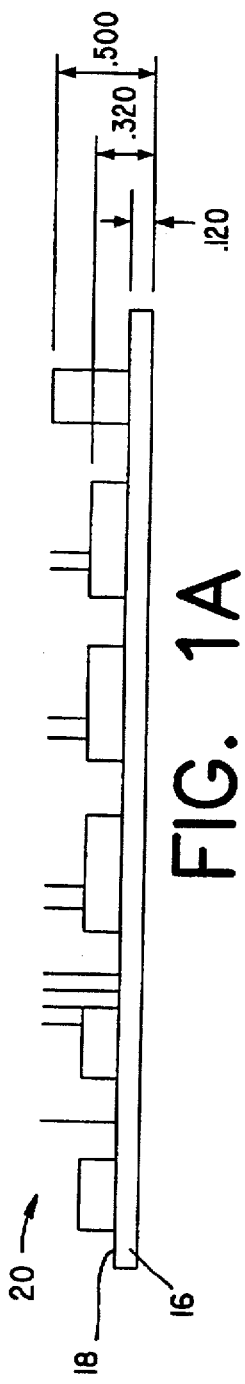
Figure 2:
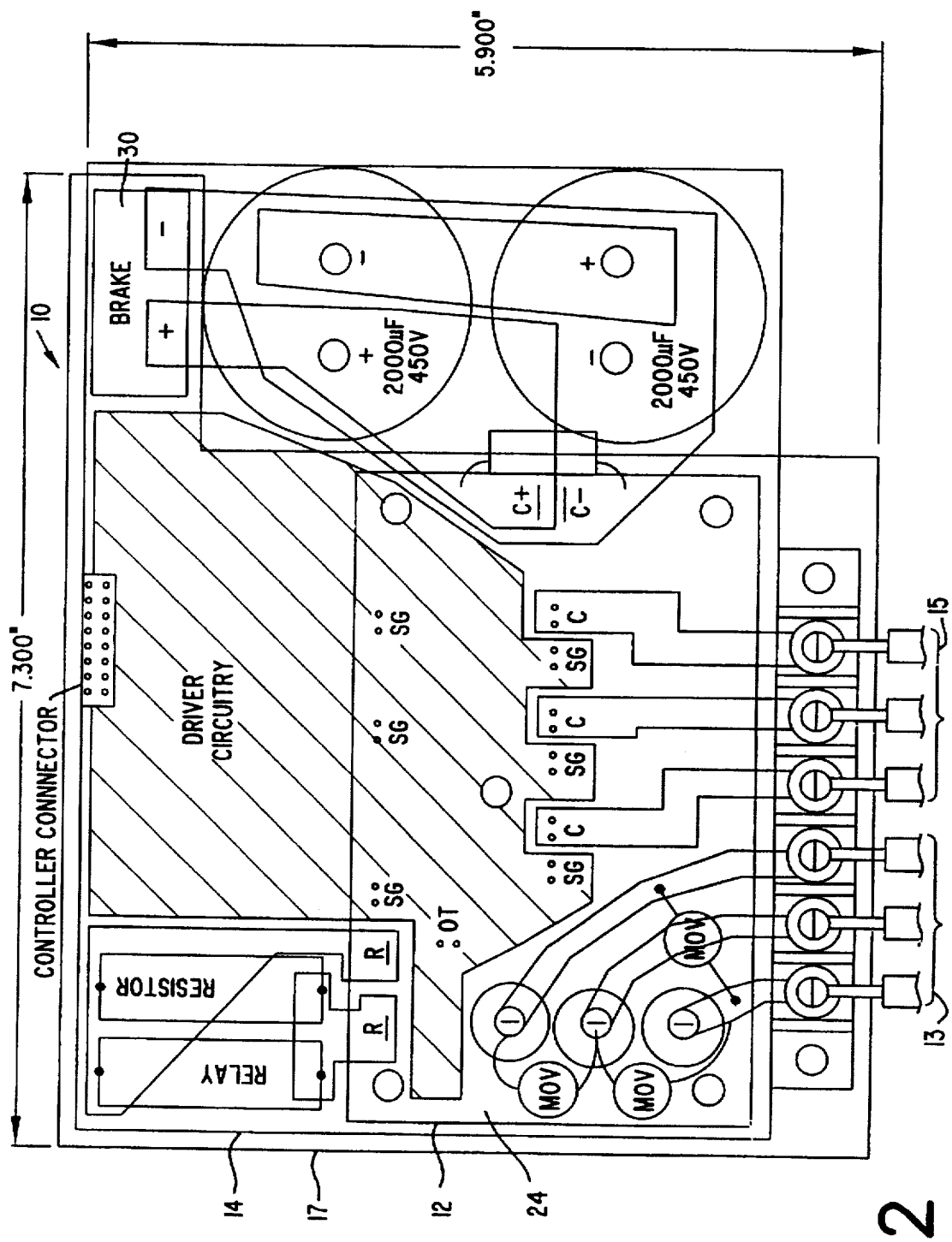
FIG. 2 is an assembly drawing of the PCB board.

With further reference to FIGS. 1 and 1a, the IMS assembly 12 is a 10 horse power SMD/IMS module which provides a power inverter, a rectifier and a thermistor, realized with transistors Q1–Q6 and diodes D1–D6. The transistors Q1–Q6 may be new single gauge or dual gauge, down leads components. The diodes D1–D6 may be SMD 220 components. The area of the IMS, which measures 5.1 by 3.7 inches, is 18.9 inches square. As shown in FIG. 1a, the height of the assembly with the components 20 is about 0.320 inches.

With reference to FIG. 2, four current transformers are provided in conjunction with three MOVs, a softstart resistor and a softstart relay. The connector to the controller is illustrated together with a connector strip for AC lines 13 and motor lines 15. Element 17 is a heat sink. Also included is a brake module 30; IGBT, FRED (fast recovery diode) and resistor (optional).

The advantages of the component layout of the present invention derive from:

1. a smaller and less expensive IMS substrate;
2. elimination of potting compounds;
3. lower inductance;
4. standard 10 HP IMS substrate; and
5. a circuit which is easily customized to customer requirements at the PCB level (including drivers, protection, MOV, softstart, snubber, brake, capacitor and external connectors and brake).

The concept of the present invention is essentially based on a novel partitioning of the power and control componentry and allocation of the same to the IMS 12 and PCB 14. The invention also provides, in novel manner, the use of vertical 100 mil center connectors to carry power and signal from the bottom IMS level to the top PCB (control) level, which is used for signal only and the power connectors. Note, all connectors are identical.

In FIG. 1, Q1–Q6 represent new single gauge or dual gauge with down leads transistors. D1–D6 comprise SMD 220s. Again, the overall IMS area is 18.9 square inches, as the IMS measures 5.1 by 3.7 inches. The height of the substrate is 0.120 inches without the components. The corresponding dimensions of the PCB 14 are 7.3 by 5.9 inches. Note the module 24, which measures 4.9 by 3.0 by 0.3 inches.

In the embodiment of FIG. 3, Q1–Q6 comprise dual gauge with up leads (emitters down) components. The size of the PCB is 4.9 by 3.000 inches, resulting in a smaller IMS area of only about 14.7 square inches. The height of the IMS board with its components 20 is shown in FIG. 3a.

Figure 4A:
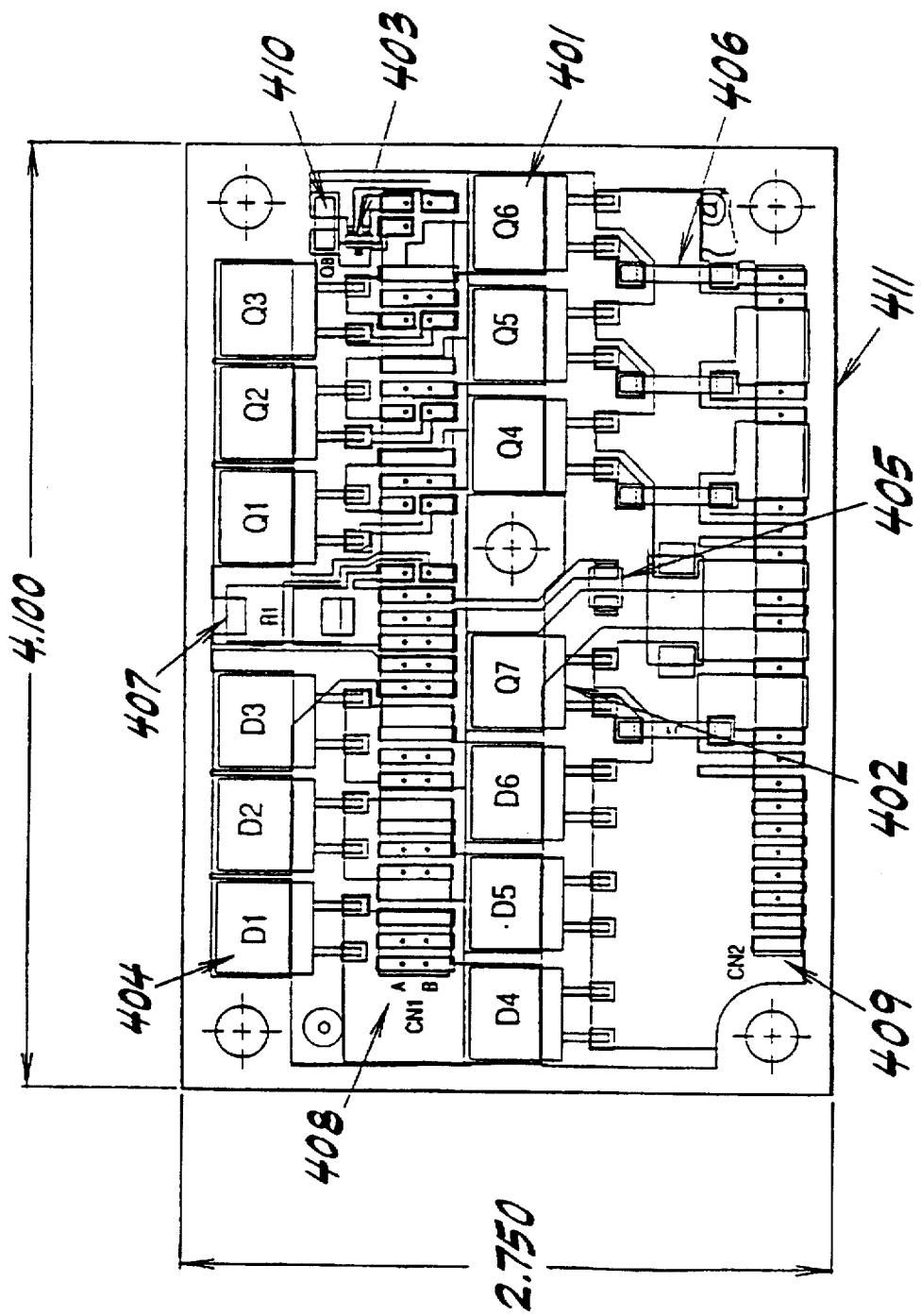

The remaining FIGS. 4a–7b are assembly and related drawings of various embodiments and requirements of the present invention. More specifically, FIG. 4a shows the IMS substrate assembly for a one horse power/SMD design measuring 2.750 by 4.100 inches. Further dimensional information is presented in FIG. 4b. Electrical components which can be used in connection with the embodiment of FIG. 4a are listed below.

| Element | Part No. | Identification | Description | Vendor |
|---|---|---|---|---|
| 401 | IRGBC30KD2-S | Q1 to Q6 | SMD-220 IGBT | IR |
| 402 | IRGBC40K-S | Q7 | SMD-220 IGBT | IR |
| 403 | LM50C | Q8 | SOT-23 Single Supply Centigrade Temp-Sensor* | National Semi-Conductor |
| 404 | 20ETS16S | D1 to D6 | SMD-220 Diode | IR |
| 405 | 10BF60 | D7 | SMB Diode | IR |
| 406 | 6179-6 | J1 to J4 | Jumper, Brass with Sn/Pb | Zeirick |
| 407 | RW2RODAR050F or RW2RODAR050J | R1 & R2 | SM Resistor .050 OHMS, 2 Watts 1% or 5% Tol. | Ohmite |
| 408 | 50281-2-68 | CN1 | Connector, Surface Mount-34 Pins Double** | Comcon |
| 409 | 50281-1-30 | CN2 | Connector, Surface Mount-30 Pins Single** | Comcon |
| 410 | 1KS821KT | TH1 | Thermistor* | Thermo Disc |
| 411 | X43-9256 | | Substrate, IMS | |
| 412 | SN62RM92BAS88 | | Solder Paste, Sn62/Pb35.7/2 Ag/0.3 Sb | Multicore |

*Use only elements 403 or 410. In other words, these items are interchangeable.
**Unwanted pins must be removed prior to assembly.

The area of the IMS board of FIG. 4a is 11.275 square inches.

Figure 5A:
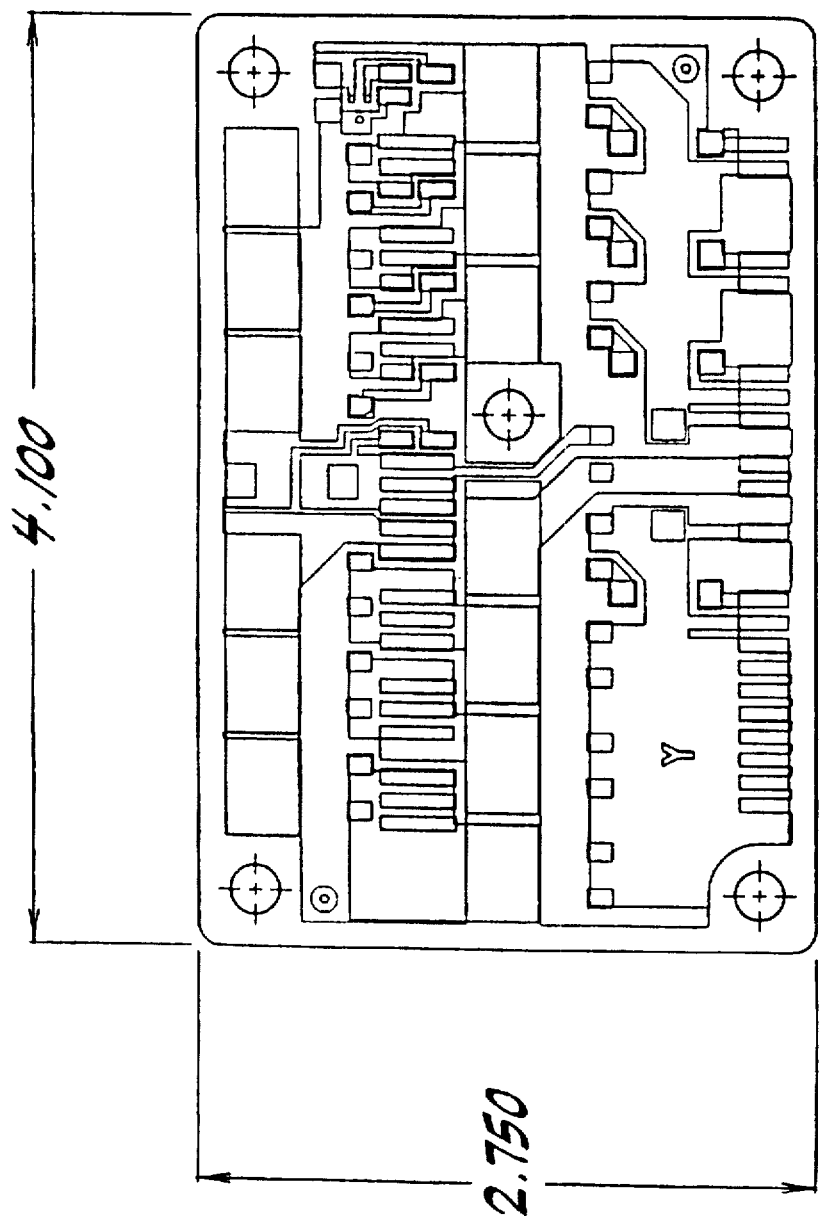
Figure 5B:
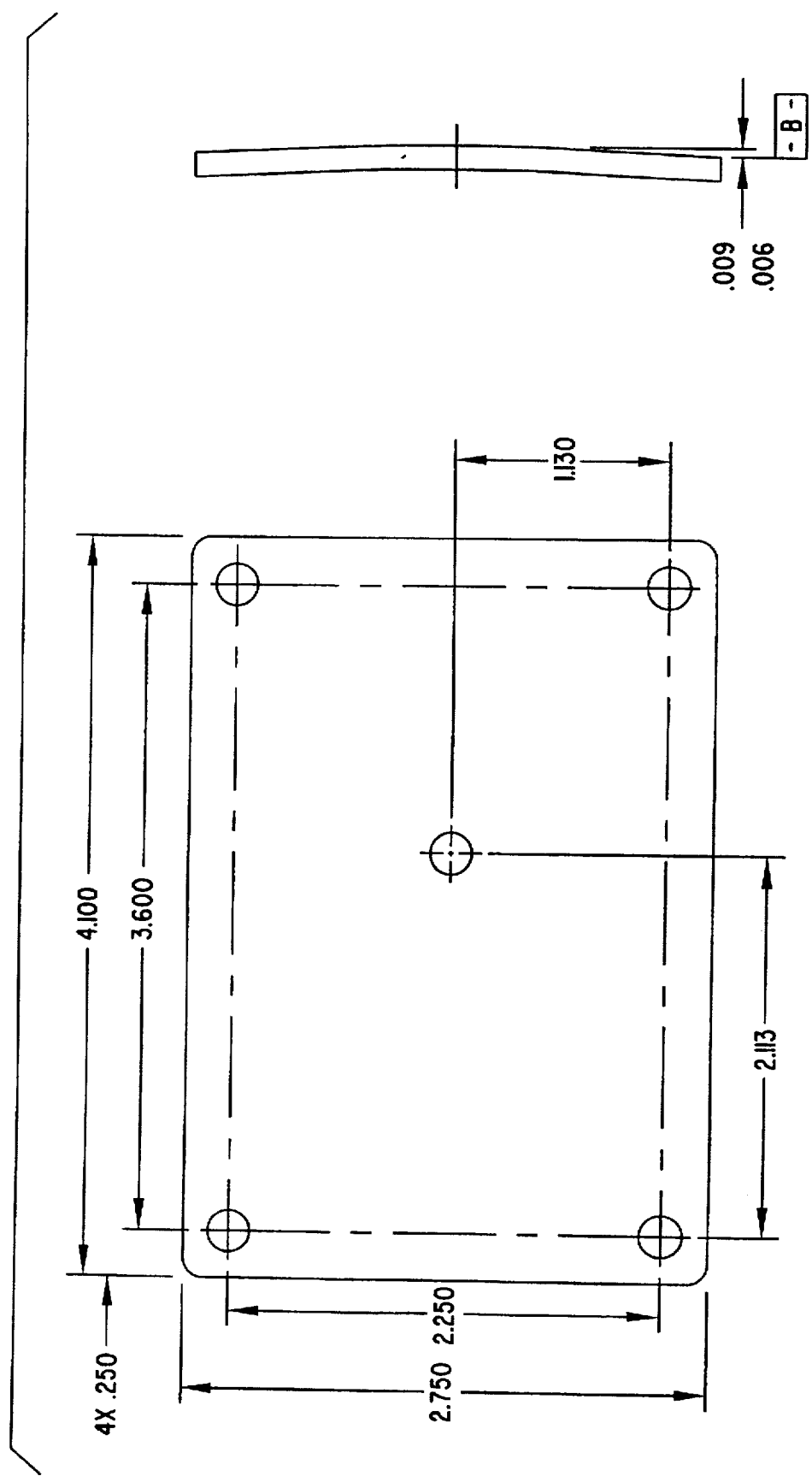
Figure 5C:
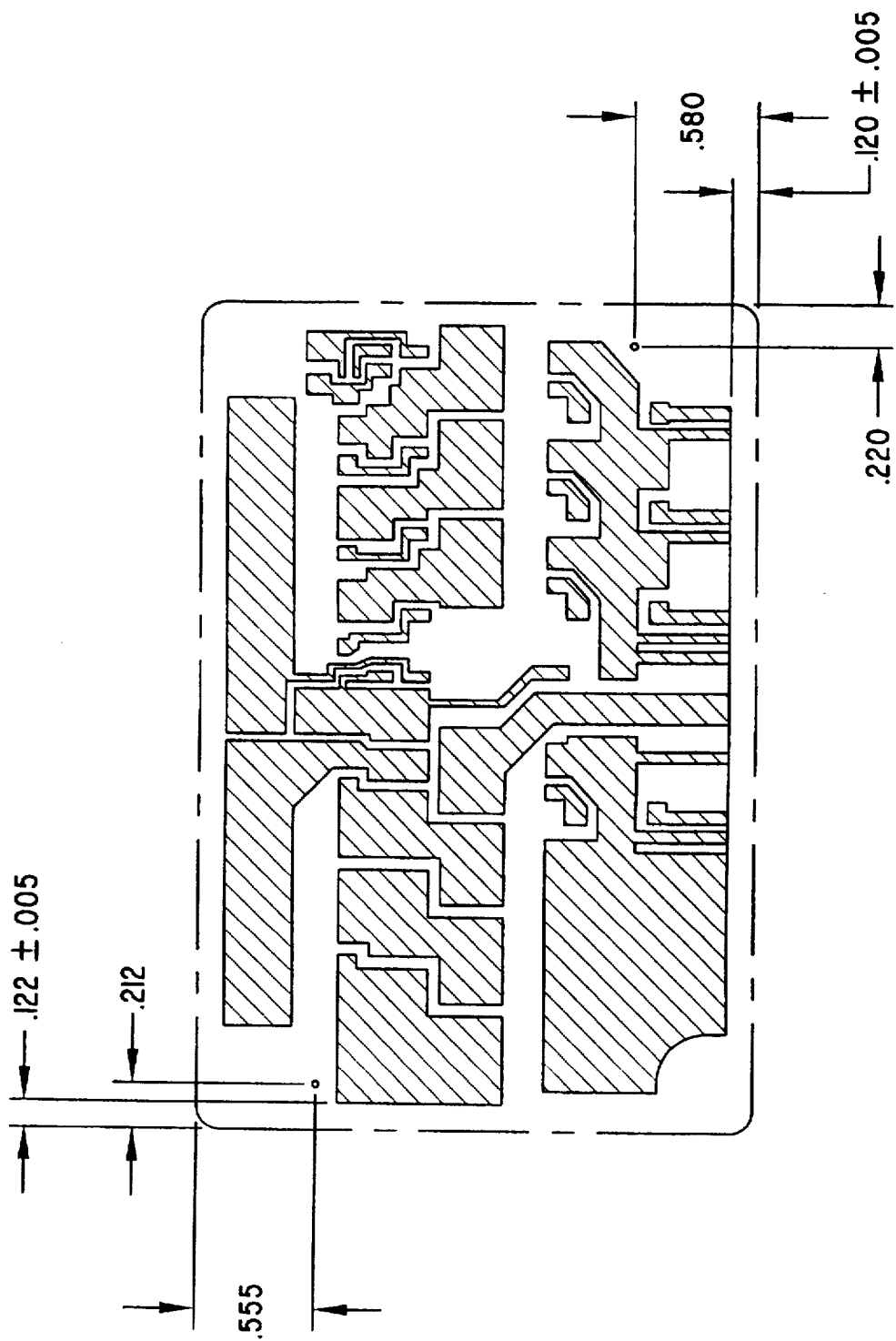
Figure 5D:
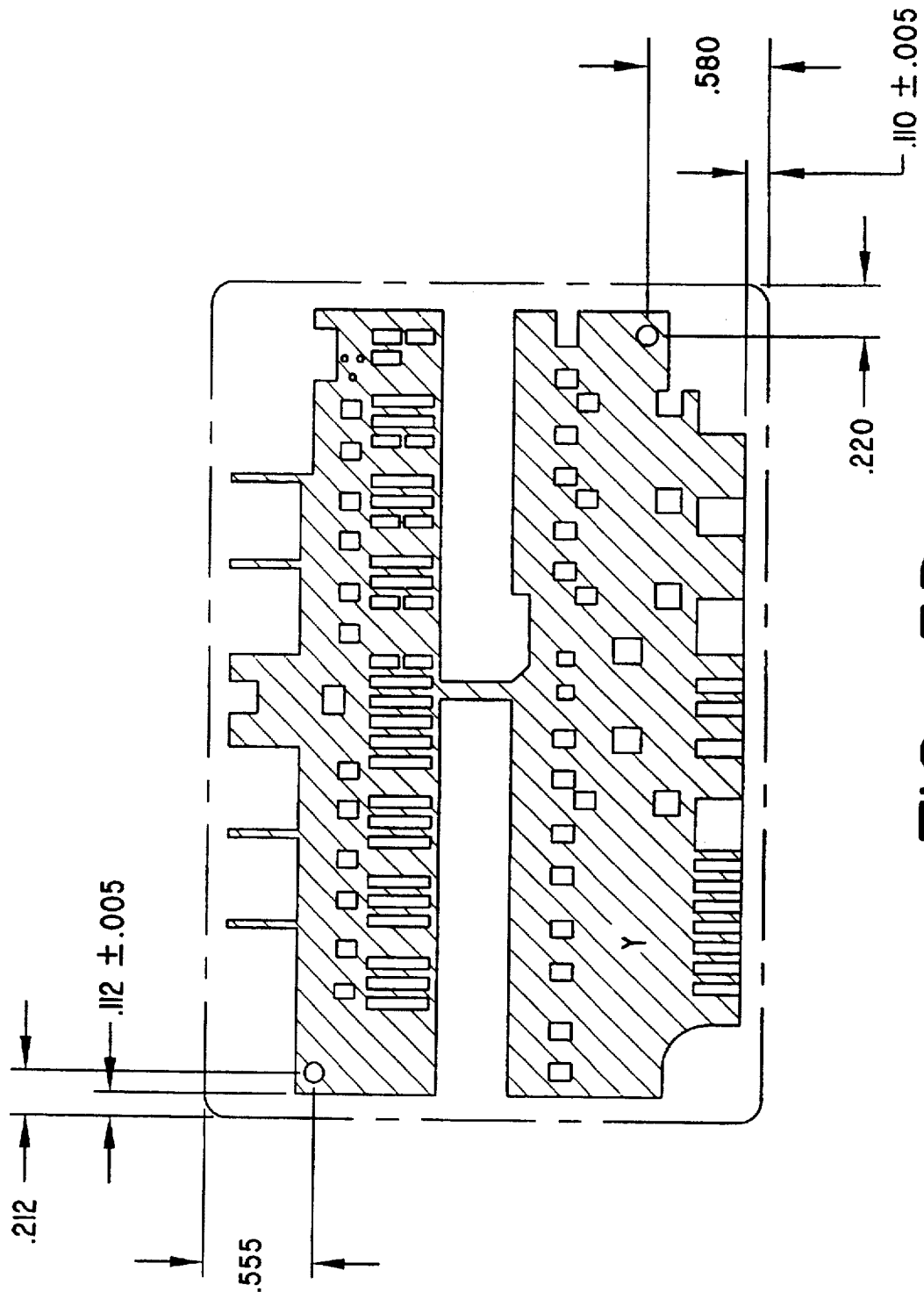

FIG. 5a is a further assembly drawing of an IMS embodiment which is operable to 600 volts. Further details of the dimensional parameters of the base plate of the device of FIG. 5a are shown in FIG. 5b. FIG. 5c is the conductor pattern of the device of FIG. 5a and FIG. 5d shows the solder resist layout thereof. Further attributes of the IMS board of FIG. 5a are noted below.

1. Dimensions are shown in inches [millimeters] unless otherwise specified.
2. Controlling dimension: inches, unless otherwise specified.
3. Baseplate:
    3.1) Material is aluminum A5052H34.
    3.2) Thickness 0.118±0.004 [3.00±0.11 mm].
    3.3) Burrs around holes 0.006 [0.15 mm] maximum.
4. Insulation film:
    4.1) Dielectric strength 3 KV AC for 1 minute.
    4.2) Thickness 0.005±0.001 in. [125±25 uM].
    4.3) Thermal conductivity $8.4 \times 10^{-3}$ CAL/°C.×CM-SEC. MIN.
    4.4) Peel strength 1.3 KG/CM minimum at 25° C. after exposure to 260° C. for 60 minute.
    4.5) Dielectric constant 7.7 (100 KHZ @23° C.).
    4.6) Specific resistivity $1 \times 10^{16}$ OHM-CM @ 23° C.
5. Conductor metalization:
    5.1) Material is copper OFHC.
    5.2) Thickness 0.0041±0.0004 [105±10 uM].
    5.3) Line definition ±0.012 in. [±300 uM].
    5.4) Flatness in solderable pads 0.006 [0.04 mm].
    5.5) Surface must be solderable with 62Sn/36Pb/2Ag with RMA flux at 200° C.

Figure 6A:
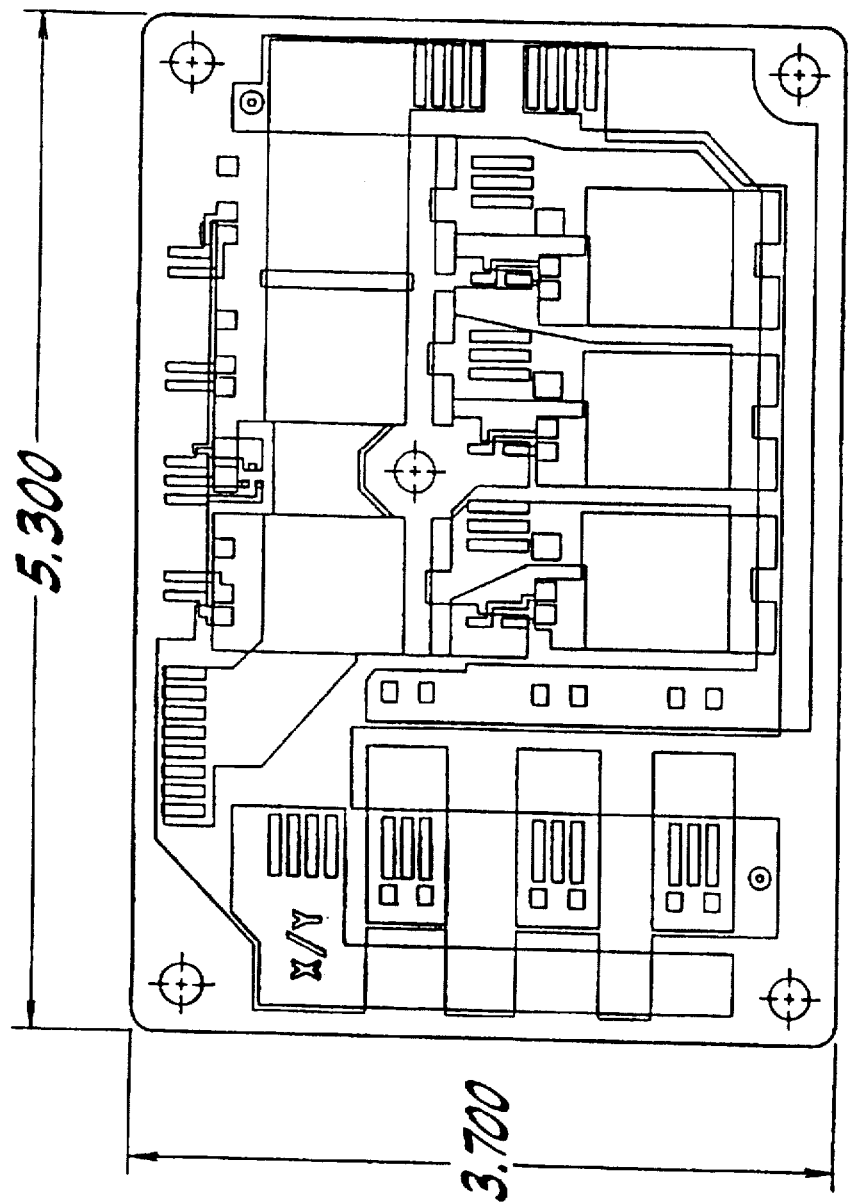
Figure 6B:
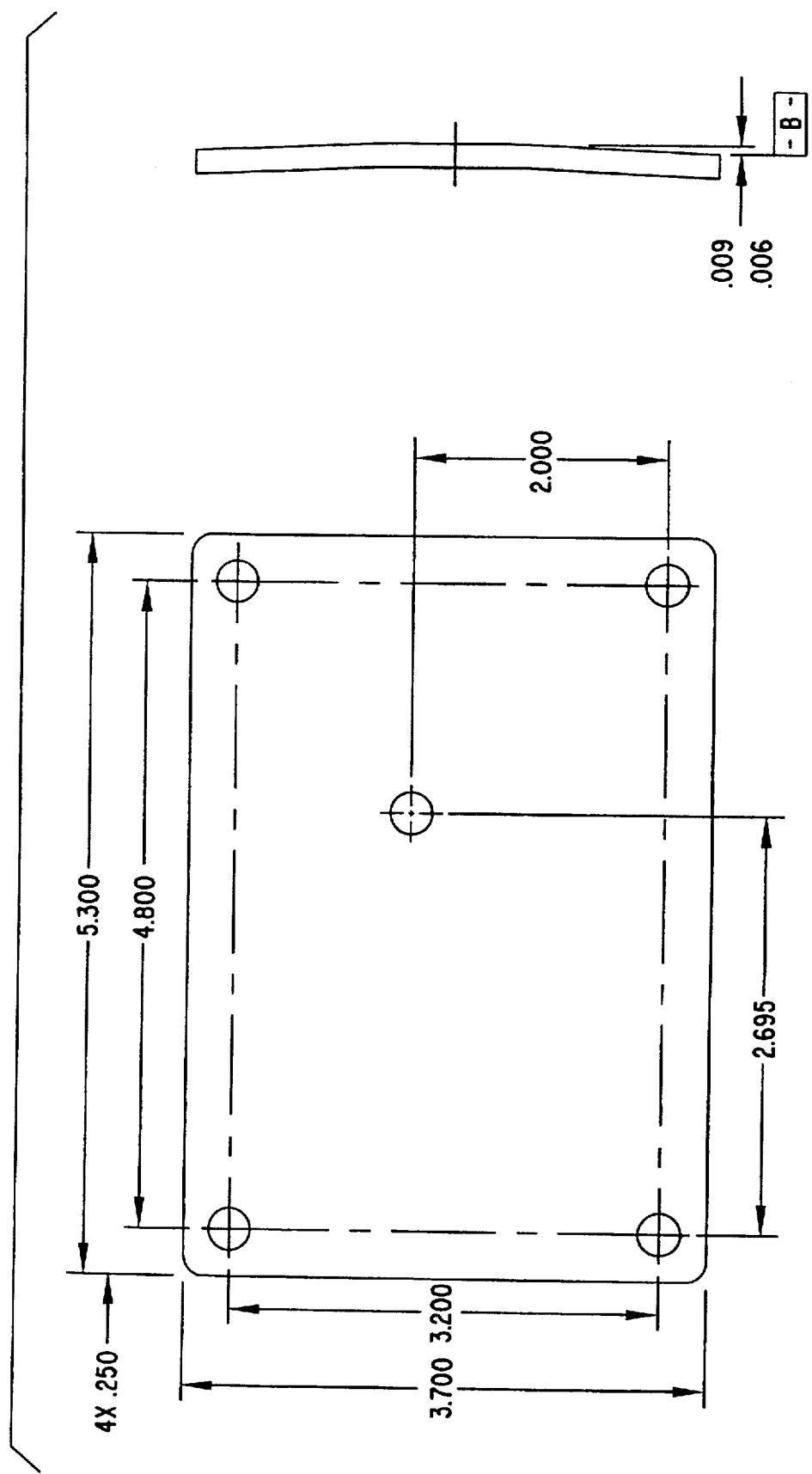
Figure 6C:
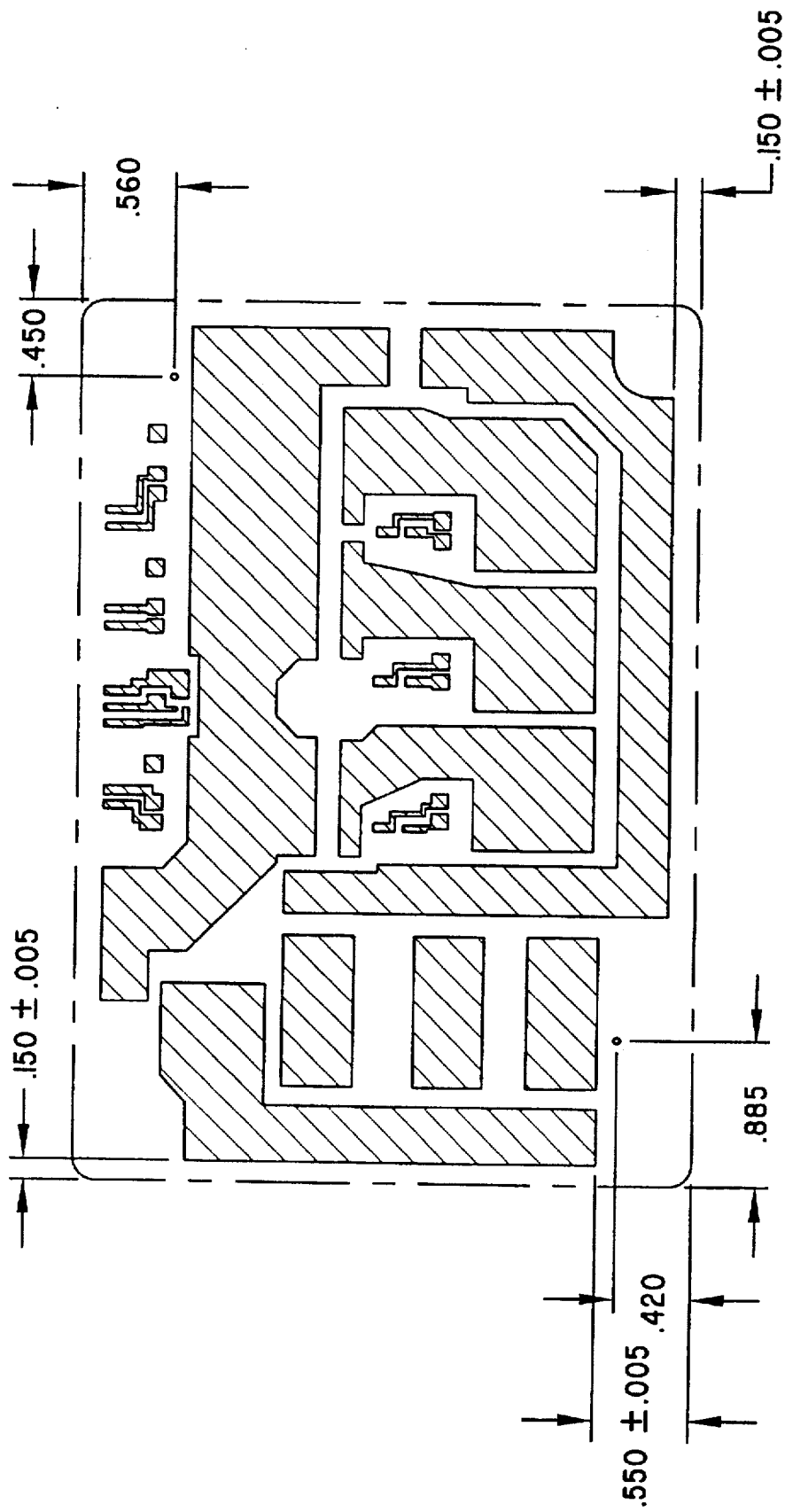
Figure 6D:
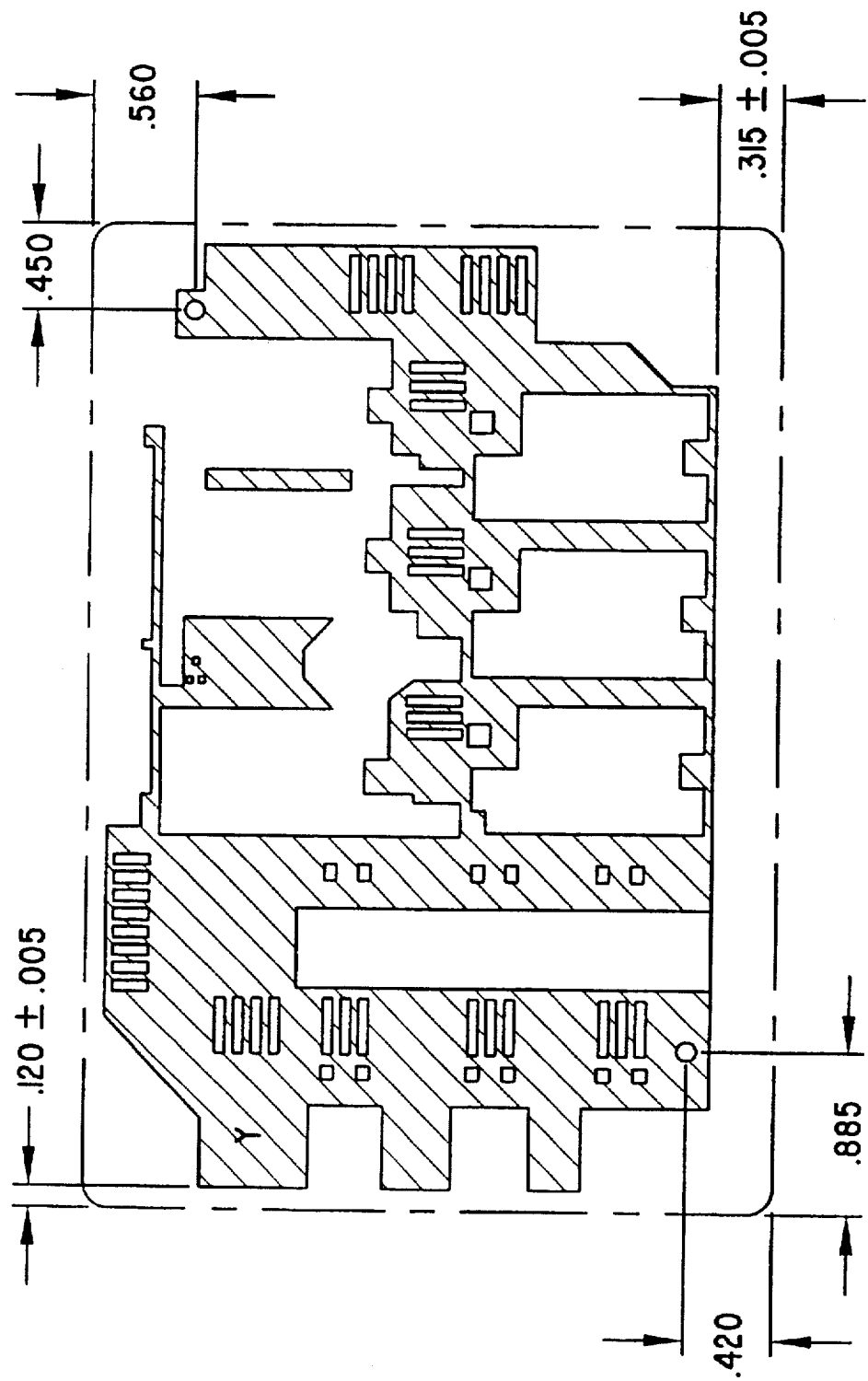
Figure 6E:
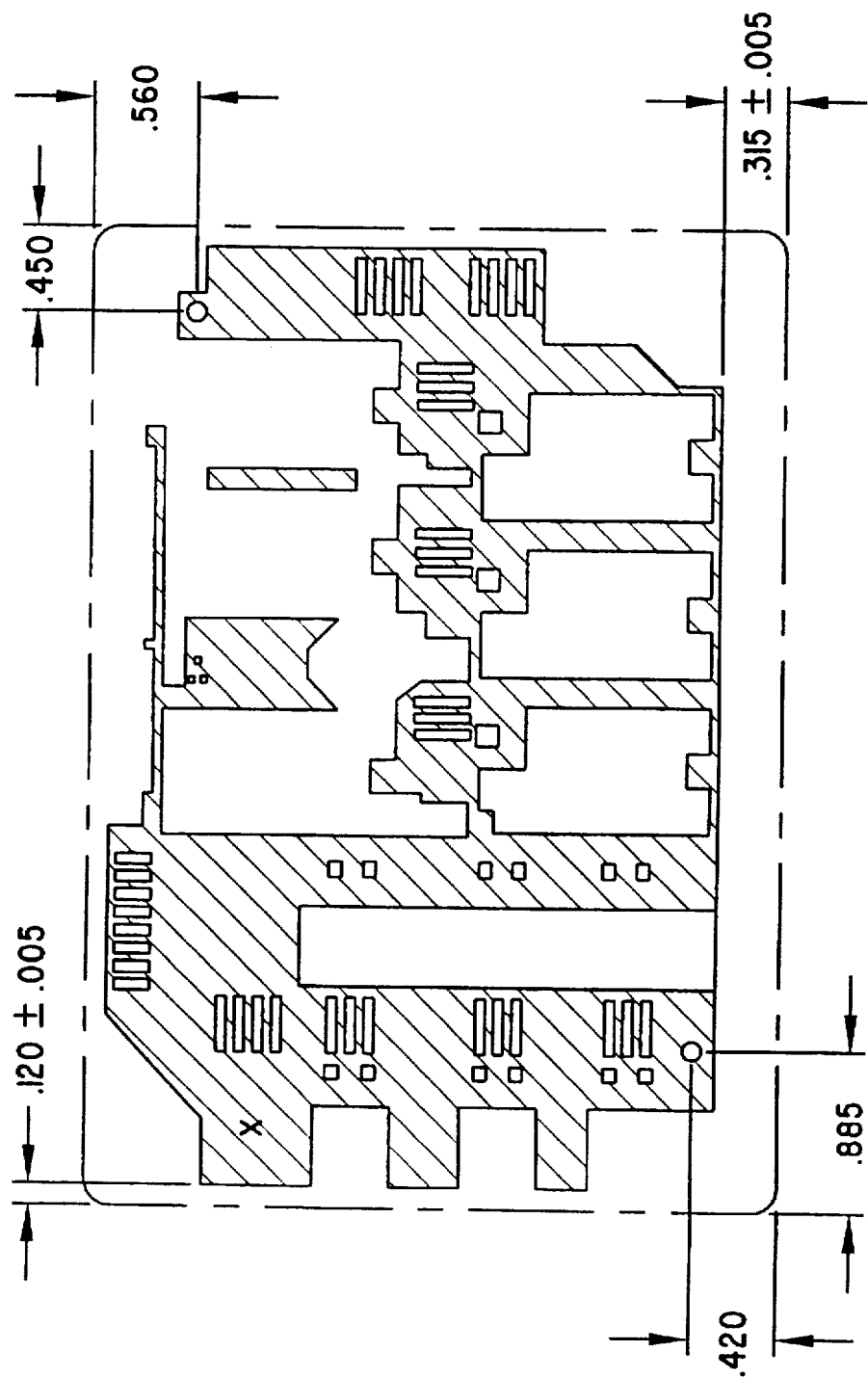

FIG. 6a is the assembly of another IMS board which is designed for 10 horsepower 600 volt or 1200 volt use. It measures 5.3 by 3.7 inches for a total area of 19.61 square inches. The base plate, conductor, solder resist (600 volts) and solder resist (1200 volts) are respectively shown in FIGS. 6b, 6c, 6d and 6e. Other parameters of this embodiment are noted below.

1. Dimensions are shown in inches [millimeters] unless otherwise specified.
2. Controlling dimension: inches, unless otherwise specified.
3. Baseplate:
    3.1) Material is aluminum A5052H34.
    3.2) Thickness 0.118±0.004 [3.00±0.11 mm].
    3.3) Burrs around holes 0.006 [0.15 mm] maximum.
4. Insulation film: (600V)
    4.1) Dielectric strength 3 KV AC for 1 minute.
    4.2) Thickness 0.005±0.001 in. [125±25 uM].
    4.3) Thermal conductivity $8.4 \times 10^{-3}$ CAL/°C.×CM-SEC. MIN.
    4.4) Peel strength 1.3 KG/CM minimum at 25° C. after exposure to 260° C. for 60 minute.
    4.5) Dielectric constant 7.7 (100 KHZ @23° C.).
    4.6) Specific resistivity $1 \times 10^{16}$ OHM-CM @ 23° C.
5. Insulation film: (1200V)
    5.1) Dielectric strength 5 KV AC for 1 minute.
    5.2) Thickness 0.007±0.001 in. [170±30 uM].
    5.3) Thermal conductivity $8.4 \times 10^{-3}$ CAL/°C.×CM-SEC. MIN.
    5.4) Peel strength 1.3 KG/CM minimum at 25° C. after exposure to 260° C. for 60 minute.
    5.5) Dielectric constant 7.7 (100 KHZ @23° C.).
    5.6) Specific resistivity $1 \times 10^{16}$ OHM-CM @ 23° C.
6. Conductor metalization:
    6.1) Material is copper OFHC.
    6.2) Thickness 0.0041±0.0004 [105±10 uM].
    6.3) Line definition ±0.012 in. [±300 uM].
    6.4) Flatness in solderable pads 0.006 [0.04 mm].
    6.5) Surface should be solderable with 62Sn/36Pb/2Ag with RMA flux at 200° C.

Figure 7A:
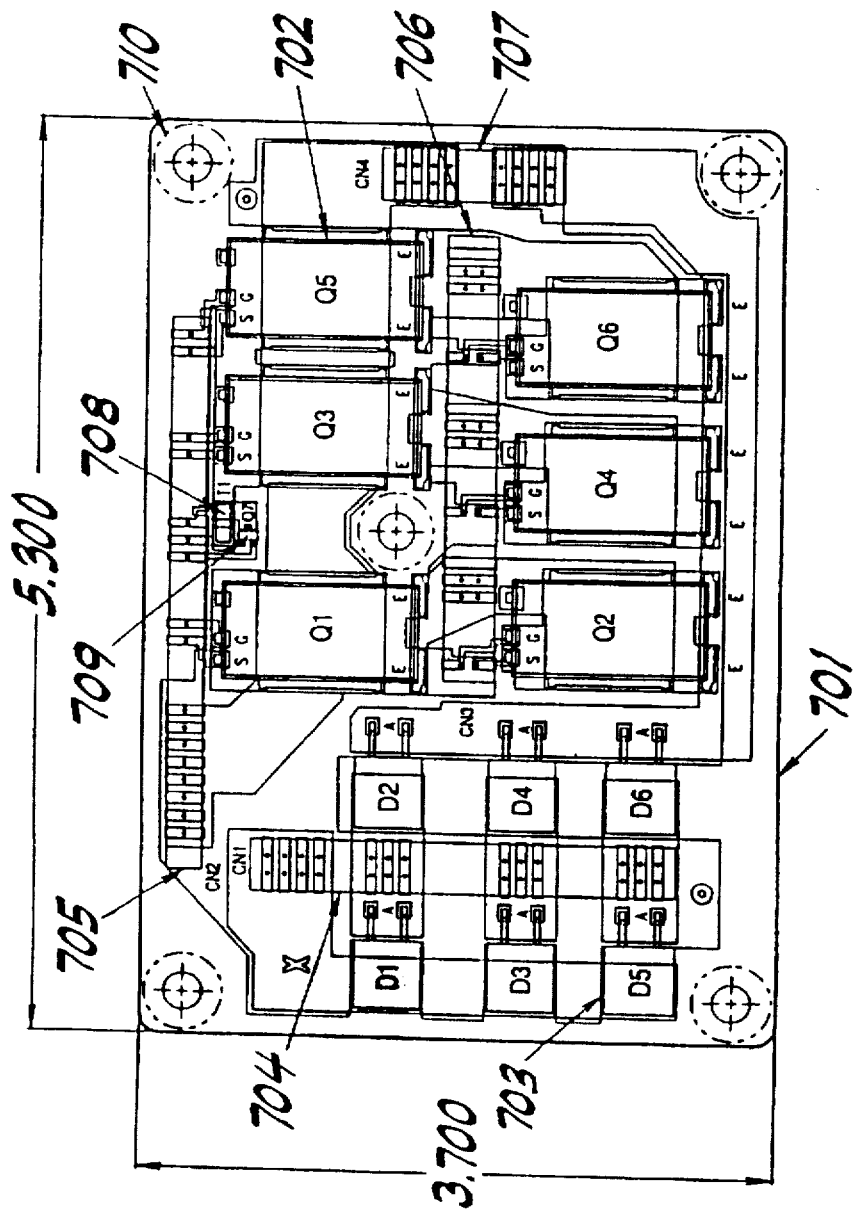
Figure 7B:
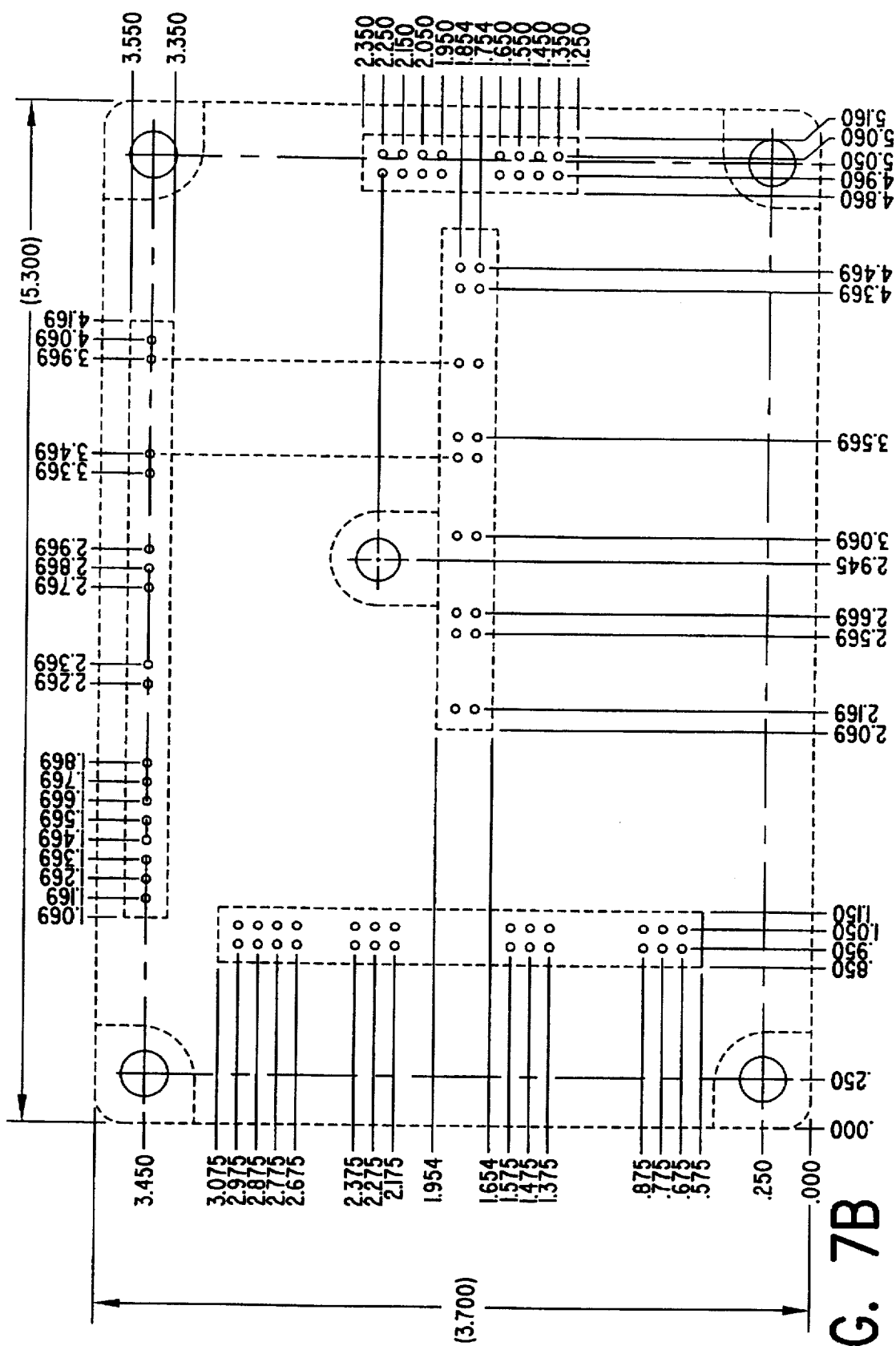

A power train assembly for a 10 horsepower, 1200 volt application is illustrated in FIG. 7a. Production and feature criteria for this assembly are shown in FIG. 7b. Further specifications of this embodiment are indicated below.

| Element | Part No. | Identification | Description | Vendor |
|---------|----------|----------------|-------------|--------|
| 701 | X43-9249-2 | | Substrate, IMS, 10HP13- | Denka/Mitsui |
| 702 | | Q1 to Q6 | SMD10/Mark II CoPAK IGBT-7/FRED 51 | IR |
| 703 | 20ETS16S | D1 to D6 | SMD220 Diode .180 × .180 | IR |
| 704 | 50335-2-26 | CN1 | Connector, 24 Pins Double | Comcon |
| 705 | 50335-1-18 | CN2 | Connector, 30 Pins Single | Comcon |
| 706 | 50335-2-18 | CN3 | Connector, 25 Pins Double | Comcon |
| 707 | 50335-2-16 | CN4 | Connector, 10 Pins Double | Comcon |
| 708 | 1KS821KT | T1 | Thermistor | MCTA |
| 709 | LM50C | Q7 | Temp Sense SOT-23 (Optional to Thermistor) | National Semi-Conductor |
| 710 | | | Stand-off | |
| 711 | SN62RM92BAS88 | | Solder Paste, Sn62/Pb36/2Ag | Multicore |
| 712 | ECCOCOAT-S7013 | | Conformal Coating, Silicone | Grace |

The concept of the present invention makes it possible to realize an IMS board with only the inverter (6 SMD 10 copaks), input rectifiers (6 SMD 220 diodes) and a thermistor on the IMS substrate. A central vertical connector provides connectivity to the PCB located overhead. The invention eliminates 10 large M5 terminals and four current transformers from the IMS substrate. This combined with the use of new single gauge package or the dual gauge package reduces the IMS substrate size from the conventional 36.5 square inches to: 1) an IMS with the single gauge—18.9 square inches (50%); or 2) an IMS with the dual gauge—14.7 square inches (40%).

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A power train assembly for delivering electrical power to a driven device, the assembly comprising:

an IMS (insulated metal substrate) board for carrying and electrically interconnecting power components and a PCB (printed circuit board) for holding control and drive components; the IMS board having mounted thereon exclusively power transistors for forming a power inverter circuit, input rectifier diodes, a thermistor and a connector for providing connectivity to the PCB, thereby realizing a standardized IMS board of comparatively smaller substrate area;

the PCB comprising said control and drive components which components include drive elements, a current sense, a connector to the IMS board, and terminals for effecting electrical connections to the driven device; and the PCB being mountable directly above the IMS board, and the respective connectors of the IMS board and the PCB mating with one another vertically.

2. The power train assembly of claim 1, in which the components on the IMS board are exclusively surface mounted components.

3. The power train assembly of claim 2, further comprising a heat sink for drawing heat away from the power train assembly and for dissipating the heat into the environment.

4. The power train assembly of claim 3, in which the PCB components include two series link capacitors.

5. The power train assembly of claim 3, in which the PCB components include a snubber capacitor.

6. The power train assembly of claim 3, in which the PCB includes a plurality of current transformers.

7. The power train assembly of claim 3, in which the PCB includes a plurality of MOV's.

8. The power train assembly of claim 3, in which the PCB includes a soft-start resistor.

9. The power train assembly of claim 3, in which the PCB includes a soft-start relay.

10. The power train assembly of claim 3, in which the terminals for effecting connection to the driven device comprises a connector strip for AC lines and motor lines.

11. The power train assembly of claim 3, in which the PCB includes a brake module.

12. The power train assembly of claim 3, in which the IMS board is standardized for a 10 horsepower operation.

13. The power train assembly of claim 3, in which the IMS board is free of potting compound and instead comprises a thin surface coating on the components thereon.

14. The power train assembly of claim 3, in which the IMS board has a surface area of about 19 square inches, thereby realizing more than a 50% reduction in board surface size.

15. The power train assembly of claim 3, in which the IMS board has a surface area of about 15 square inches, thereby realizing more than a 40% reduction in board surface size.

16. The power train assembly of claim 3, in which the IMS board has height dimension on the order of about 0.50 inches.

* * * * *